US008710866B2

(12) United States Patent
Park et al.

(10) Patent No.: US 8,710,866 B2
(45) Date of Patent: Apr. 29, 2014

(54) INVERTER, NAND GATE, AND NOR GATE

(71) Applicant: Electronics and Telecommunications Research Institute, Daejeon (KR)

(72) Inventors: Sang Hee Park, Daejeon (KR); Chi Sun Hwang, Daejeon (KR); Sung Min Yoon, Daejeon (KR); Him Chan Oh, Seoul (KR); Kee Chan Park, Gyeonggi-do (KR); Tao Ren, Seoul (KR); Hong Kyun Leem, Seoul (KR); Min Woo Oh, Seoul (KR); Ji Sun Kim, Gyeonggi-do (KR); Jae Eun Pi, Gyeonggi-do (KR); Byeong Hoon Kim, Gyeonggi-do (KR); Byoung Gon Yu, Daejeon (KR)

(73) Assignees: Electronics and Telecomunications Research Institute, Daejeon (KR); Konkuk University Industrial Cooperation Corp., Seoul (KR)

( * ) Notice: Subject to any disclaimer, the term of this patent is extended or adjusted under 35 U.S.C. 154(b) by 0 days.

(21) Appl. No.: 14/050,313

(22) Filed: Oct. 9, 2013

(65) Prior Publication Data
US 2014/0035622 A1 Feb. 6, 2014

Related U.S. Application Data

(62) Division of application No. 13/355,479, filed on Jan. 20, 2012, now Pat. No. 8,570,066.

(30) Foreign Application Priority Data

Mar. 24, 2011 (KR) .................. 10-2011-0026428
Aug. 26, 2011 (KR) .................. 10-2011-0085561

(51) Int. Cl.
H03K 19/20 (2006.01)

(52) U.S. Cl.
USPC ..................... 326/104; 326/112; 326/122

(58) Field of Classification Search
None
See application file for complete search history.

(56) References Cited

U.S. PATENT DOCUMENTS

| 7,663,405 | B2 * | 2/2010 | Tam ........................... 326/83 |
| 8,013,633 | B2 | 9/2011 | Luo et al. |
| 8,432,385 | B2 * | 4/2013 | Osame et al. ............. 345/205 |
| 2007/0182448 | A1 | 8/2007 | Kwon et al. |
| 2009/0256784 | A1 | 10/2009 | Ahn |

FOREIGN PATENT DOCUMENTS

| KR | 2003-0076775 A | 9/2003 |
| KR | 2004-0057407 A | 7/2004 |
| KR | 2007-0117900 A | 12/2007 |

OTHER PUBLICATIONS

Sang-Hoon Jung et al., "A New Low Power PMOS Poly-Si inverter and Driving Circuits for Active Matrix Displays", SID 03 Digest, vol. 34, May 2003, pp. 1396-1399.

* cited by examiner

Primary Examiner — Anh Tran
(74) Attorney, Agent, or Firm — Rabin & Berdo, P.C.

(57) ABSTRACT

Disclosed are an inverter, a NAND gate, and a NOR gate. The inverter includes: a pull-up unit constituted by a second thin film transistor outputting a first power voltage to an output terminal according to a voltage applied to a gate; a pull-down unit constituted by a fifth thin film transistor outputting a ground voltage to the output terminal according to an input signal applied to a gate; and a pull-up driver applying a second power voltage or the ground voltage to the gate of the second thin film transistor according to the input signal.

7 Claims, 16 Drawing Sheets

< PRIOR ART >

INVERTER, NAND GATE, AND NOR GATE

CROSS-REFERENCE TO RELATED APPLICATIONS

This application is a divisional of application Ser. No. 13/355,479, filed on Jan. 20, 2012. Furthermore, this application claims the benefit of priority of Korean Patent Application 10-2011-0026428, filed on Mar. 24, 2011, and 10-2011-0085561, filed on Aug. 26, 2011. The disclosures of these prior U.S. and Korean applications are incorporated herein by reference.

TECHNICAL FIELD

The present disclosure relates to a logic circuit incorporated in a liquid crystal display, and more particularly, to an inverter, a NAND gate, and a NOR gate which are low in power consumption and have the same voltage variation range of an input signal and an output signal.

BACKGROUND

In recent years, a liquid crystal display incorporates various circuits constituted by a thin film transistor (hereinafter, referred to as "TFT") in order to improve display performance and reduce power consumption. An existing complementary metal-oxide-semiconductor (CMOS) circuit is used to easily configure various circuits, but a manufacturing process is complicated, such that manufacturing cost increases.

Therefore, a technology in which a circuit such as a scan driver is constituted by only one of N-type and P-type TFTs has been primarily reported. However, the circuit which can be constituted by only the N-type or P-type TFT has been very limited up to now. In particular, a method for effectively configuring the inverter, the NAND gate, and the NOR gate which are basic components constituting a digital circuit has not ever been reported.

FIG. 1 shows an existing inverter circuit constituted by only the N-type TFT.

Referring to FIG. 1, since a pull-up transistor M2 is turned on regardless of an input signal at all times, an output voltage cannot decrease to 0 V and when a pull-down transistor M1 is turned on, current flows between a power voltage VDD and a ground voltage GND, such that power consumption is very high.

SUMMARY

The present disclosure has been made in an effort to provide an inverter, a NAND gate, and a NOR gate which are low in power consumption and have the same voltage variation range of an input signal and an output signal.

A first exemplary embodiment of the present disclosure provides an inverter including: a pull-up unit constituted by a second thin film transistor outputting a first power voltage to an output terminal according to a voltage applied to a gate; a pull-down unit constituted by a fifth thin film transistor outputting a ground voltage to the output terminal according to an input signal applied to a gate; and a pull-up driver applying a second power voltage or the ground voltage to the gate of the second thin film transistor according to the input signal.

A second exemplary embodiment of the present disclosure provides a NAND gate, including: a pull-up unit constituted by a second thin film transistor outputting a first power voltage to an output terminal according to a voltage applied to a gate and a seventh thin film transistor outputting the first power voltage to the output terminal according to a voltage applied to a gate; a pull-down unit constituted by a fifth thin film transistor transferring a ground voltage according to a first input signal applied to a gate and a tenth thin film transistor outputting the ground voltage transferred from the fifth thin film transistor to the output terminal according to a second input signal applied to a gate; and a pull-up driver applying a second power voltage or the ground voltage to the gate of the second thin film transistor according to the first input signal and applying the second power voltage or the ground voltage to the gate of the seventh thin film transistor according to the second input signal.

A third exemplary embodiment of the present disclosure provides a NOR gate, including: a pull-down unit constituted by a fifth thin film transistor transferring a ground voltage according to a first input signal applied to a gate and a tenth thin film transistor outputting the ground voltage to an output terminal according to a second input signal applied to a gate; a pull-up unit constituted by a second thin film transistor transferring a first power voltage according to a voltage applied to a gate and a seventh thin film transistor outputting a ground voltage transferred from the fifth thin film transistor or a first power voltage transferred from the second thin film transistor to the output terminal according to a voltage applied to a gate; and a pull-up driver applying a second power voltage or the ground voltage to the gate of the second thin film transistor according to the first input signal and applying the second power voltage or the ground voltage to the gate of the seventh thin film transistor according to the second input signal.

According to exemplary embodiments of the present disclosure, in a digital logic circuit incorporated in a liquid crystal display, by providing an inverter, a NAND gate, and a NOR gate in which only when input and output signals vary, current flows and when the input and output signals are maintained to be high or low, no current flows, a digital logic circuit driven at low power consumption equivalent to a CMOS circuit is provided.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In exemplary embodiments of the present disclosure, an inverter, a NAND gate, and a NOR gate constituted by N-type thin film transistors (hereinafter, referred to as 'TFTs') are described as examples, but are not limited thereto and the inverter, the NAND gate, and the NOR gate may be constituted by P-type TFTs configured by inverting the N-type TFTs.

Figure 1:
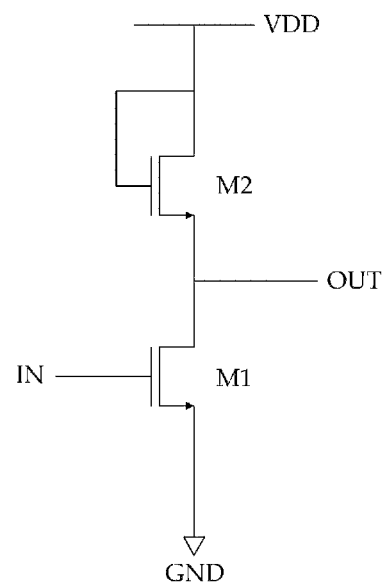
FIG. 1 shows an existing inverter circuit constituted by only an N-type TFT.
Figure 2:
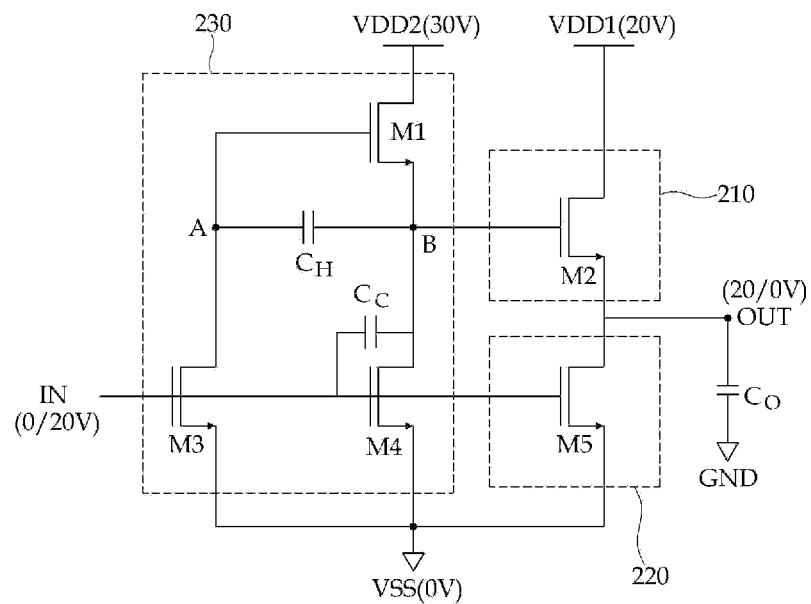
FIG. 2 is a circuit diagram showing a configuration of an inverter according to a first exemplary embodiment of the present disclosure.

FIG. 2 is a circuit diagram showing a configuration of an inverter according to a first exemplary embodiment of the present disclosure.

Referring to FIG. 2, the inverter according to the exemplary embodiment of the present disclosure includes a pull-up unit 210, a pull-down unit 220, and a pull-up driver 230.

The pull-up unit 210 is constituted by a second TFT M2 that outputs a first power voltage VDD1 to an output terminal OUT according to a voltage applied to a gate. To this end, in the second TFT M2, a gate is connected to a second node B, a drain is connected to the first power voltage VDD1, and a source is connected to the output terminal OUT.

The pull-down unit 220 is constituted by a fifth TFT M5 that outputs a ground voltage VSS to the output terminal OUT according to an input signal applied to the gate. To this end, in the fifth TFT M5, the gate is connected to an input terminal IN, a drain is connected to the output terminal OUT, and a source is connected to the ground voltage VSS.

The pull-up driver 230 applies a second power voltage VDD2 or the ground voltage VSS to the gate of the second TFT M2 according to the input signal.

To this end, the pull-up driver 230 includes a first TFT M1 in which a gate is connected to a first node A, a drain is connected to the second power voltage VDD2, and a source is connected to the second node B, a third TFT M3 in which a gate is connected to the input terminal IN, a drain is connected to the first node A, and a source is connected to the ground voltage VSS, a fourth TFT M4 in which a gate is connected to the input terminal IN, a drain is connected to the second node B, and a source is connected to the ground voltage VSS, and a capacitance coupled capacitor $C_C$ connected between the gate and the drain of the fourth TFT M4.

The pull-up driver 230 may further include a hold-up capacitor $C_H$ that is connected between the first node A and the second node B to hold the voltage of the first node A not to be decreased even though leakage current flows on the third TFT M3.

Hereinafter, an operational principle of the inverter having the above configuration will be described.

Figure 3:
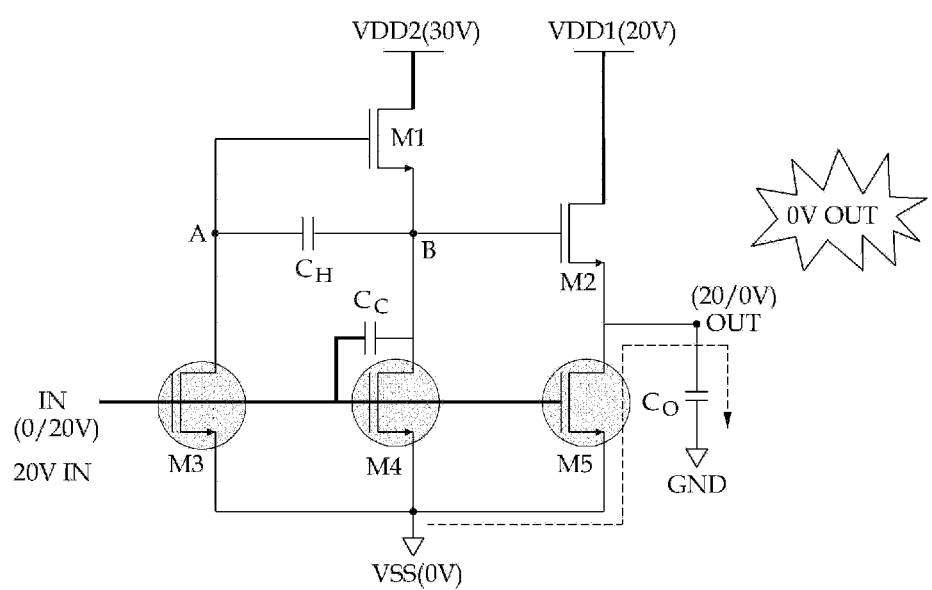
FIG. 3 is a diagram for describing an operational principle of an inverter when an input signal in a high state is inputted.

FIG. 3 is a diagram for describing an operational principle of an inverter when an input signal in a high state is inputted.

Referring to FIG. 3, when the input signal in the high state is inputted into the input terminal IN, 20 V is applied to the gates of the third to fifth TFTs M3 to M5, which are turned on. Therefore, the first node A and the second node B are connected to the ground voltage VSS to be 0 V, and 0 V is applied to the gates of the first TFT M1 and the second TFT M2, which are turned off. In this case, since the second TFT M2 which is the pull-up TFT is turned off and the fifth TFT M5 which is the pull-down TFT is turned on, an output signal is low (0 V). Since the first TFT M1 and the second TFT M2 connected to the first power voltage VDD1 and the second power voltage VDD2, respectively are turned off, constant current does not flow.

Figure 4:
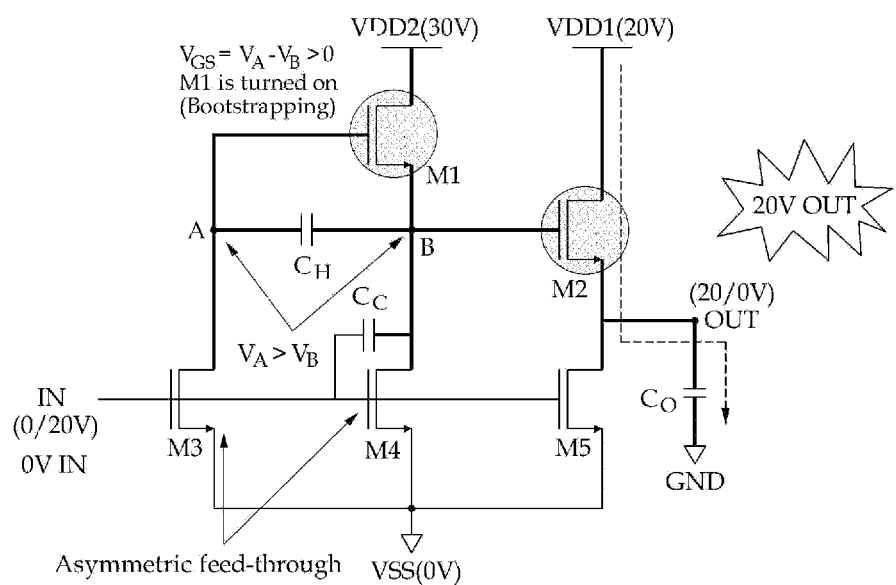
FIG. 4 is a diagram for describing an operational principle of the inverter when an input signal in a low state is inputted.

FIG. 4 is a diagram for describing an operational principle of the inverter when an input signal in a low state is inputted.

Figure 5:
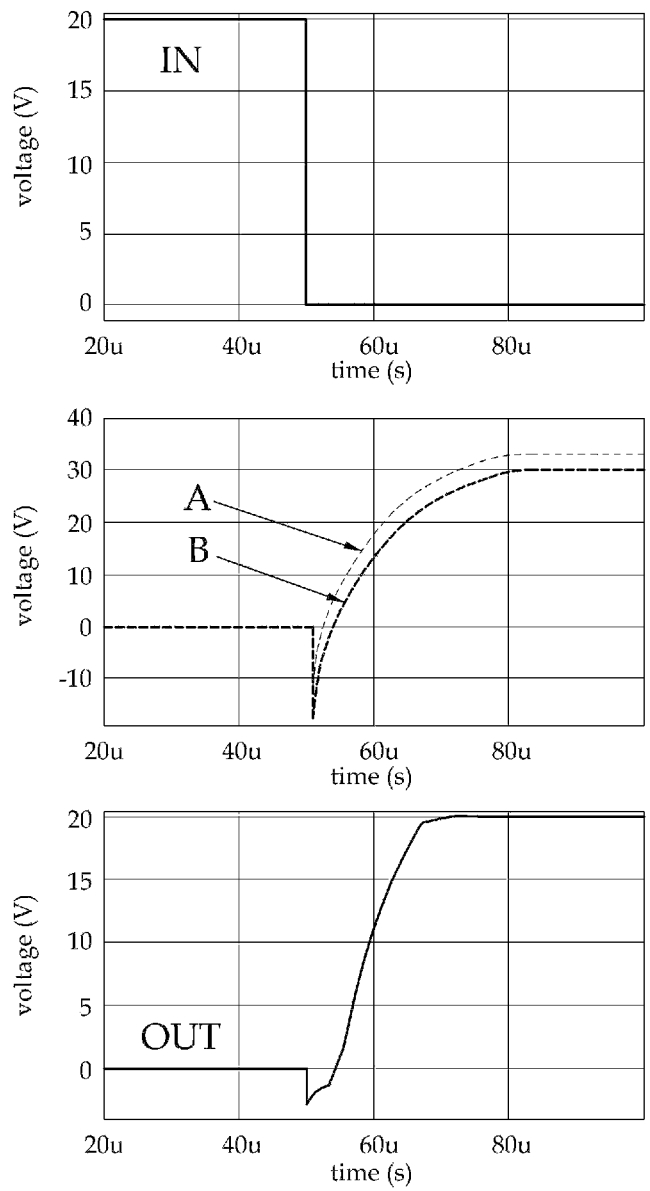
FIG. 5 is a graph showing SPICE simulation results of an input terminal, a first node, a second node, and an output terminal in the inverter of FIG. 4.

Referring to FIG. 4, when the input signal in the low state is inputted into the input terminal IN, 0V is applied to the gates of the third to fifth TFTs M3 to M5, and as a result, all the third to fifth TFTs M3 to M5 are turned off. The voltages of the first node A and the second node B decrease to 0 V or less due to capacitive coupling with the input signal through the third TFT M3, the fourth TFT M4, and the capacitance coupled capacitor $C_C$. Herein, when the capacity of the capacitance coupled capacitor Cc is larger than the capacitance of the gate of the third TFT M3, the voltage of the second node B decreases more than the voltage of the first node A as shown in FIG. 5. The first TFT M1 is turned on due to such an asymmetric feed-through effect. As a result, the second node B is connected with the second power voltage VDD2, such that the voltage of the second node B increases and due to a bootstrapping effect, the voltage of the first node A increases more than the voltage of the second node B. Therefore, while the first TFT M1 is turned on, the voltage of the second node B increases up to 30 V as shown in FIG. 5. Consequently, since the second power voltage VDD2 is applied to the gate of the second TFT M2 as the pull-up TFT, which is turned on and 0 V is applied to the gate of the fifth TFT M5 as the pull-down TFT, which is turned off, the output voltage becomes 20 V which is equivalent to the first power voltage VDD1. Even in this case, since the third to fifth TFTs M3 to M5 connected to the ground voltage VSS are all turned off, the constant current does not flow.

Meanwhile, when the input signal is low, the voltage of the first node A may decrease due to leakage current through the third TFT M3. Therefore, the hold-up capacitor $C_H$ serves to hold the voltage of the first node A not to be decreased even though a small amount of leakage current flows on the third TFT M3.

Figure 6:
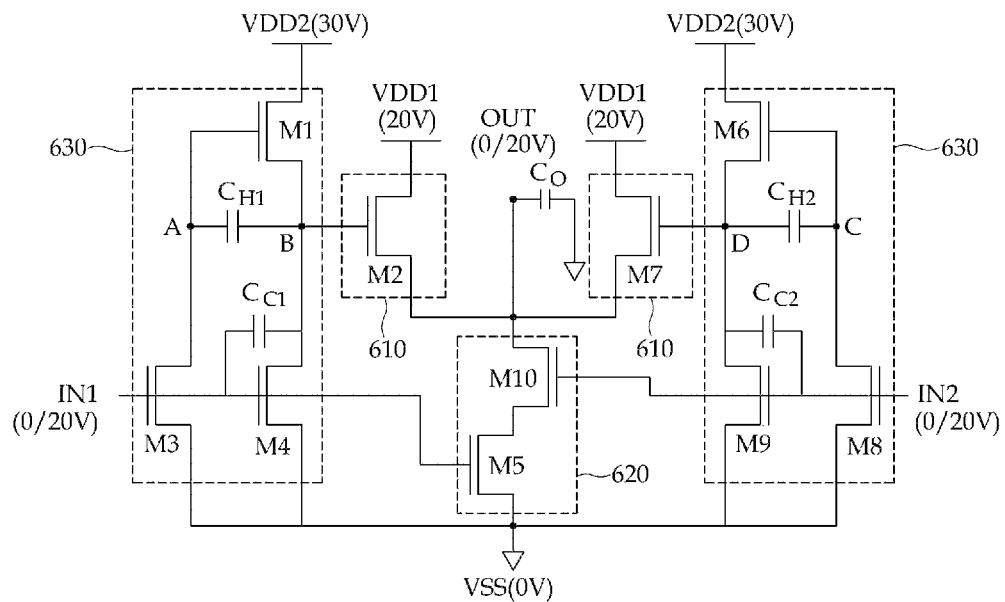
FIG. 6 is a circuit diagram showing a configuration of a NAND gate according to a second exemplary embodiment of the present disclosure.

FIG. 6 is a circuit diagram showing a configuration of a NAND gate according to a second exemplary embodiment of the present disclosure.

Referring to FIG. 6, the NAND gate according to the exemplary embodiment of the present disclosure includes a pull-up unit 610, a pull-down unit 620, and a pull-up driver 630.

The pull-up unit 610 is constituted by a second TFT M2 outputting the first power voltage VDD1 to the output terminal OUT according to a voltage applied to a gate and a seventh TFT M7 outputting the first power voltage VDD1 to the output terminal OUT according to a voltage applied to a gate. To this end, in the second TFT M2, the gate is connected to a second node B, a drain is connected to the first power voltage VDD1, and a source is connected to the output terminal OUT. In the seventh TFT M2, the gate is connected to a fourth node D, a drain is connected to the first power voltage VDD1, and a source is connected to the output terminal OUT.

The pull-down unit 620 is constituted by a fifth TFT M5 transferring the ground voltage VSS according to a first input signal applied to a gate and a tenth TFT M10 outputting the ground voltage VSS transferred from the fifth TFT M5 to the output terminal OUT according to a second input signal applied to a gate. To this end, in the fifth TFT M5, the gate is connected to a first input terminal IN1, a drain is connected to a source of the tenth TFT M10, and a source is connected to the ground voltage VSS. In the tenth TFT M10, a gate is connected to a second input terminal IN2, a drain is connected to the output terminal OUT, and a source is connected to the drain of the fifth TFT M5.

The pull-up driver 630 applies the second power voltage VDD2 or the ground voltage VSS to the gate of the second TFT M2 according to the first input signal and applies the second power voltage VDD2 or the ground voltage VSS to the gate of the seventh TFT M7 according to the second input signal.

To this end, the pull-up driver 630 includes a first TFT M1 in which a gate is connected to a first node A, a drain is connected to the second power voltage VDD2, and a source is connected to the second node B, a third TFT M3 in which a gate is connected to the first input terminal IN1, a drain is connected to the first node A, and a source is connected to the ground voltage VSS, a fourth TFT M4 in which a gate is connected to the first input terminal IN1, a drain is connected to the second node B, and a source is connected to the ground voltage VSS, a first capacitance coupled capacitor $C_{C1}$ connected between the gate and the drain of the fourth TMT M4, a sixth TFT M6 in which a gate is connected to a third node C, a drain is connected to the second power voltage VDD2 and a source is connected to the fourth node D, an eighth TFT M8 in which a gate is connected to the second input terminal IN2, a drain is connected to the third node C, and a source is connected to the ground voltage VSS, a ninth TFT M9 in which a gate is connected to the second input terminal IN2, a drain is connected to the fourth node D, and a source is connected to the ground voltage VSS, and a second capacitance coupled capacitor $C_{C2}$ connected between the gate and the drain of the ninth TFT M9.

The pull-up driver 630 may further include a first hold-up capacitor $C_{H1}$ that is connected between the first node A and the second node B to hold the voltage of the first node A not to be decreased even though the leakage current flows on the third TFT M3 and a second hold-up capacitor $C_{H2}$ that is connected between the third node C and the fourth node D to hold the voltage of the third node C not to be decreased even though the leakage current flows on the eighth TFT M8.

Hereinafter, the operational principal of the NAND gate having the above configuration will be described with reference to the timing diagram of FIG. 7.

Figure 7:
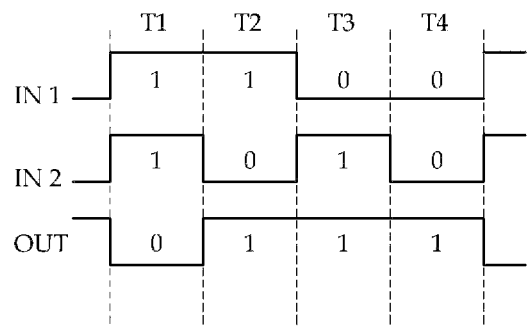
FIG. 7 is a timing diagram of the NAND gate according to the second exemplary embodiment of the present disclosure.
Figure 8:
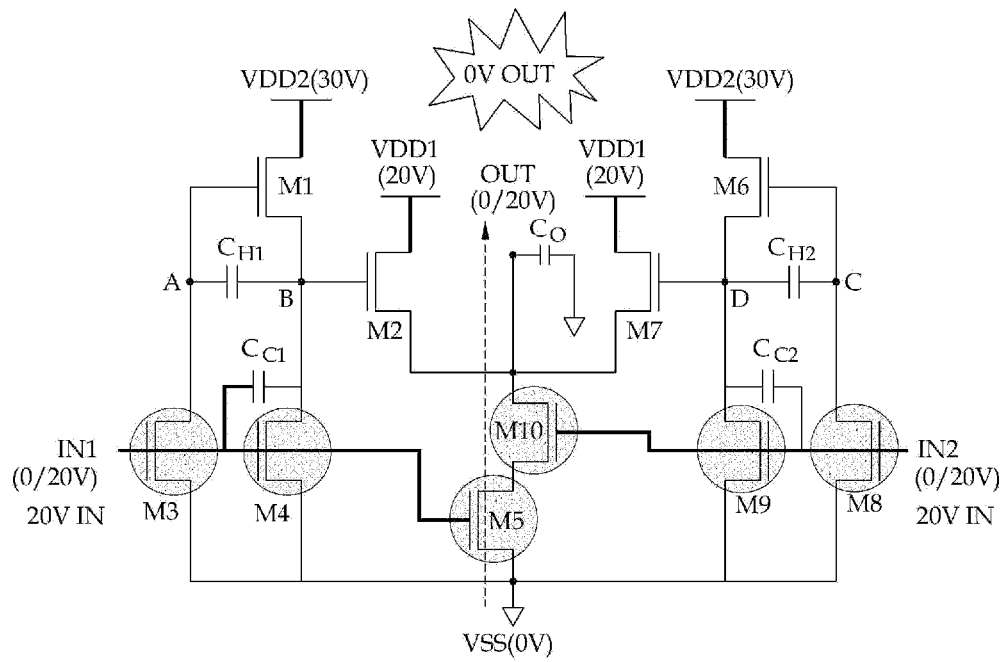
FIG. 8 is a diagram for describing an operational principle of the NAND gate in section T1 of FIG. 7.

FIG. 8 is a diagram for describing an operational principle of the NAND gate in section T1 of FIG. 7.

Referring to FIG. 8, when the first input signal in the high state is inputted into the first input terminal IN1 and the second input signal in the high state is inputted into the second input terminal IN2, the third to fifth TFTs M3 to M5 at the side of the first input terminal IN1 are turned on, and the first TFT M1 and the second TFT M2 are turned off like the inverter. The eighth to tenth TFTs M8 to M10 at the side of the second input terminal IN2 are turned on, and the sixth TFT M6 and the seventh TFT M7 are turned off. In this case, since the fifth TFT M5 and the tenth TFT M10 are turned on, the output terminal OUT is connected to the ground voltage VSS, such that the output voltage becomes 0 V. In this case, since the first TFT M1, the second TFT M2, the sixth TFT M6, and the seventh TFT M7 connected to the first power voltage VDD1 and the second power voltage VDD2 are all turned off, constant current does not flow.

Figure 9:
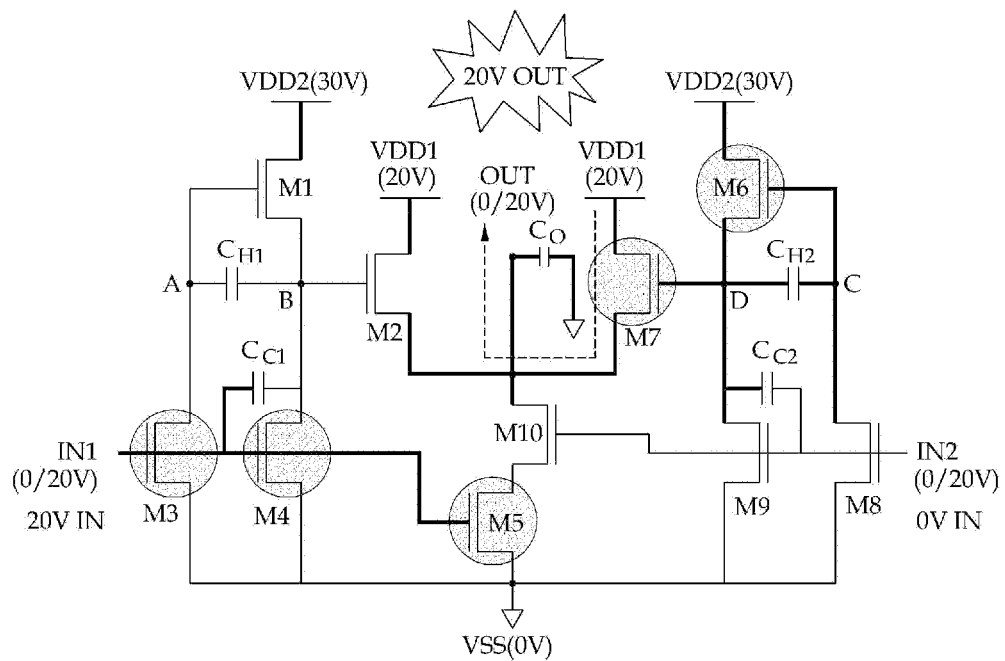
FIG. 9 is a diagram for describing the operational principle of the NAND gate in section T2 of FIG. 7.

FIG. 9 is a diagram for describing the operational principle of the NAND gate in section T2 of FIG. 7.

Referring to FIG. 9, when the first input signal in the high state is inputted into the first input terminal IN1 and the second input signal in the low state is inputted into the second input terminal IN2, the third to fifth TFTs M3 to M5 at the side of the first input terminal IN1 are turned on, and the first TFT M1 and the second TFT M2 are turned off. On the contrary, the eighth to tenth TFTs M8 to M10 at the side of the second input terminal IN2 are turned off, and the sixth TFT M6 and the seventh TFT M7 are turned on. Herein, the sixth TFT M6 is turned on by the asymmetric feed-through effect and the bootstrapping effect like the inverter. In this case, since the fifth TFT M5 is turned on, but the tenth TFT M10 is turned off, the output terminal OUT is not connected to the ground voltage VSS. However, since the seventh TFT M7 is turned on, the first power voltage VDD1 is connected to the output terminal OUT, such that the output voltage becomes 20 V. In this case, since at least one TFT is turned off between the first power voltage VDD1 and the second power voltage VDD2, and the ground voltage VSS, constant current does not flow.

Figure 10:
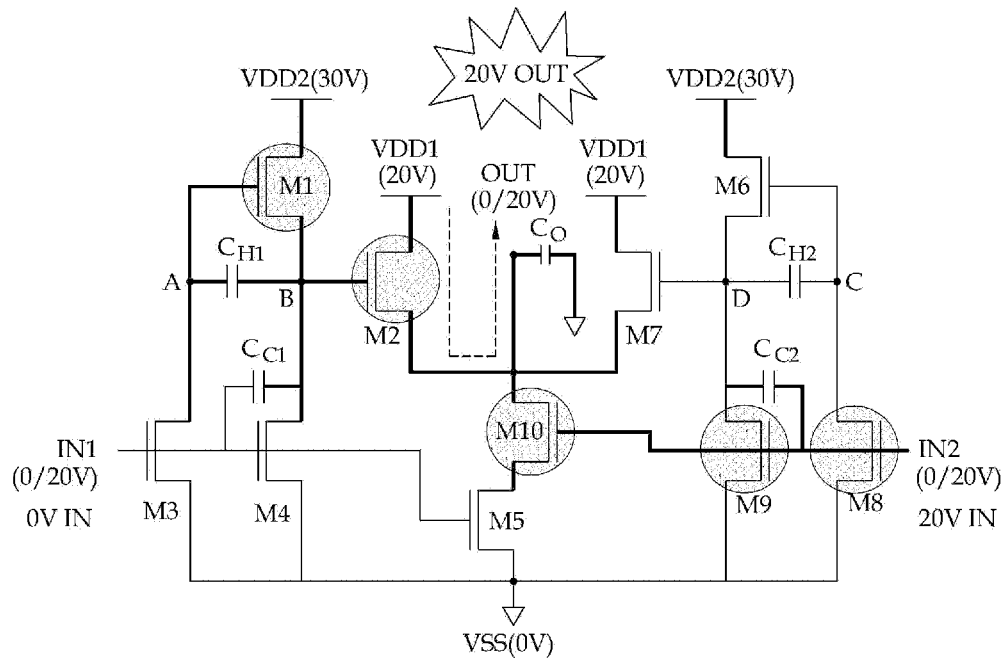
FIG. 10 is a diagram for describing an operational principle of the NAND gate in section T3 of FIG. 7.

FIG. 10 is a diagram for describing an operational principle of the NAND gate in section T3 of FIG. 7.

Referring to FIG. 10, when the first input signal in the low state is inputted into the first input terminal IN1 and the second input signal in the high state is inputted into the second input terminal IN2, the third to fifth TFTs M3 to M5 at the side of the first input terminal IN1 are turned off, and the first TFT M1 and the second TFT M2 are turned on. On the contrary, the eighth to tenth TFTs M8 to M10 at the side of the second input terminal IN2 are turned on, and the sixth TFT M6 and the seventh TFT M7 are turned off. In this case, since the tenth TFT M10 is turned on, but the fifth TFT M5 is turned off, the output terminal OUT is not connected to the ground voltage VSS. However, since the second TFT M2 is turned on, the first power voltage VDD1 is connected to the output terminal OUT, such that the output voltage becomes 20 V. In this case, since at least one TFT is turned off between the first power voltage VDD1 and the second power voltage VDD2, and the ground voltage VSS, constant current does not flow.

Figure 11:
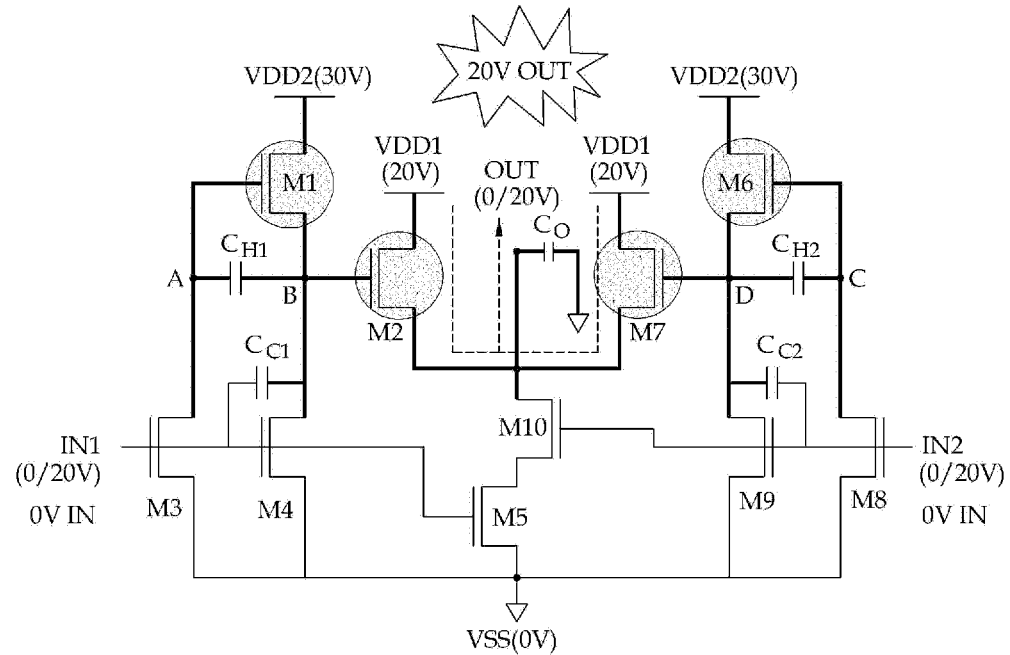
FIG. 11 is a diagram for describing an operational principle of the NAND gate in section T4 of FIG. 7.

FIG. 11 is a diagram for describing the operational principle of the NAND gate in section T4 of FIG. 7.

Referring to FIG. 11, when the first input signal in the low state is inputted into the first input terminal IN1 and the second input signal in the low state is inputted into the second input terminal IN2, the third to fifth TFTs M3 to M5 at the side of the first input terminal IN1 are turned off, and the first TFT M1 and the second TFT M2 are turned on. The eighth to tenth TFTs M8 to M10 at the side of the second input terminal IN2 are turned off, and the sixth TFT M6 and the seventh TFT M7 are turned on. In this case, since the fifth TFT M5 and the tenth TFT M10 are turned off, the output terminal OUT is not connected to the ground voltage VSS. However, since the second TFT M2 and the seventh TFT M7 are turned on, the first power voltage VDD1 is connected to the output terminal OUT, such that the output voltage becomes 20 V. Even in this case, since the third to fifth TFTs M3 to M5 and the eighth to tenth TFTs M8 to M10 connected to the ground voltage VSS are all turned off, the constant current does not flow.

Figure 12:
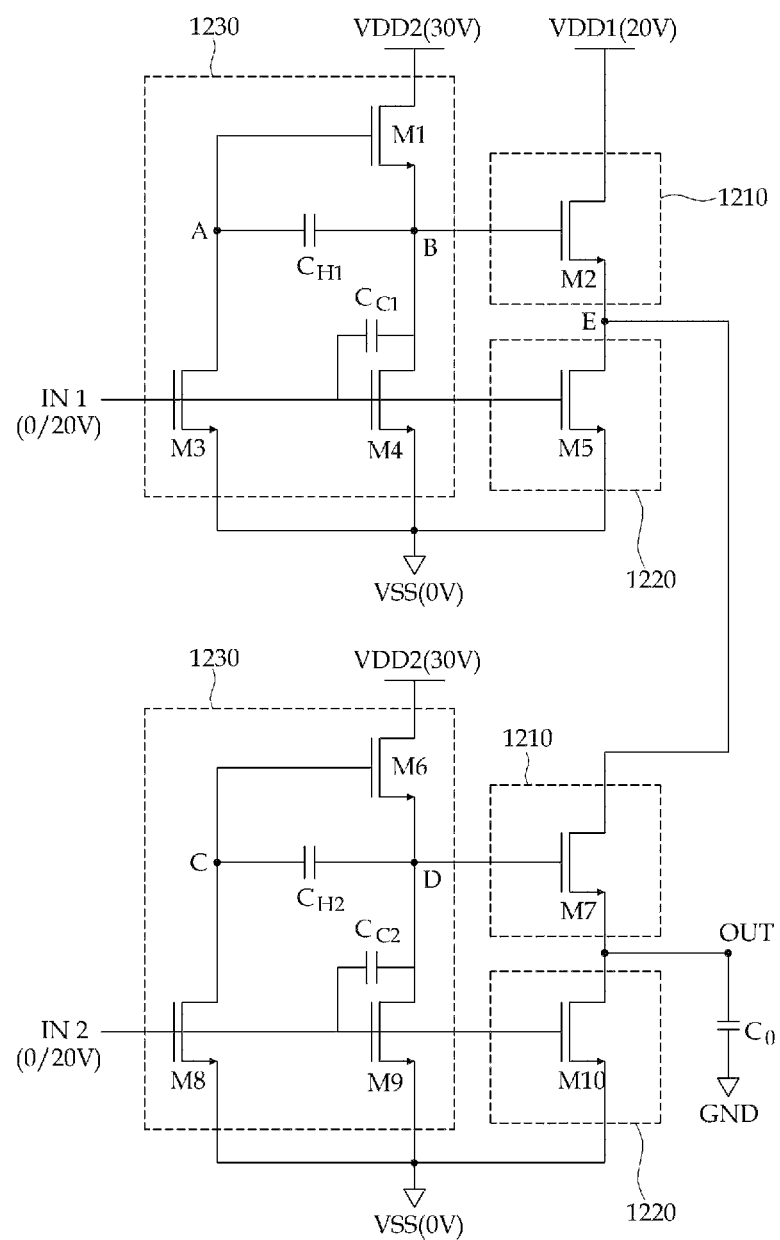
FIG. 12 is a circuit diagram showing a configuration of a NOR gate according to a third exemplary embodiment of the present disclosure.

FIG. 12 is a circuit diagram showing a configuration of a NOR gate according to a third exemplary embodiment of the present disclosure.

Referring to FIG. 12, the NOR gate according to the exemplary embodiment of the present disclosure includes a pull-up unit 1210, a pull-down unit 1220, and a pull-up driver 1230.

The pull-up unit 1210 is constituted by a second TFT M2 transferring the first power voltage VDD1 according to a voltage applied to a gate and a seventh TFT M7 outputting the ground voltage VSS transferred from a fifth TFT M5 or the first power voltage VDD1 transferred from the second TFT M2 to the output terminal OUT according to a voltage applied to a gate. To this end, in the second TFT M2, the gate is connected to a second node B, a drain is connected to the first power voltage VDD1, and a source is connected to a fifth node E. In the seventh TFT M7, the gate is connected to a fourth node D, a drain is connected to the fifth node E, and a source is connected to the output terminal OUT.

The pull-down unit 1220 is constituted by a fifth TFT M5 transferring the ground voltage VSS according to a first input signal applied to a gate and a tenth TFT M10 outputting the ground voltage VSS to the output terminal OUT according to a second input signal applied to a gate. To this end, in the fifth TFT M5, the gate is connected to a first input terminal IN1, a drain is connected to the fifth node E, and a source is connected to the ground voltage VSS. In the tenth TFT M10, a gate is connected to a second input terminal IN2, a drain is connected to the output terminal OUT, and a source is connected to the ground voltage VSS.

The pull-up driver 1230 applies the second power voltage VDD2 or the ground voltage VSS to the gate of the second TFT M2 according to the first input signal and applies the second power voltage VDD2 or the ground voltage VSS to the gate of the seventh TFT M7 according to the second input signal.

To this end, the pull-up driver 1230 includes a first TFT M1 in which a gate is connected to a first node A, a drain is connected to the second power voltage VDD2, and a source is connected to the second node B, a third TFT M3 in which a gate is connected to the first input terminal IN1, a drain is connected to the first node A, and a source is connected to the ground voltage VSS, a fourth TFT M4 in which a gate is connected to the first input terminal IN1, a drain is connected to the second node B, and a source is connected to the ground voltage VSS, a first capacitance coupled capacitor $C_{C1}$ connected between the gate and the drain of the fourth TFT M4, a sixth TFT M6 in which a gate is connected to a third node C, a drain is connected to the second power voltage VDD2 and a source is connected to the fourth node D, an eighth TFT M8 in which a gate is connected to the second input terminal IN2, a drain is connected to the third node C, and a source is connected to the ground voltage VSS, a ninth TFT M9 in which a gate is connected to the second input terminal IN2, a drain is connected to the fourth drain D, and a source is connected to the ground voltage VSS, and a second capacitance coupled capacitor $C_{C2}$ connected between the gate and the drain of the ninth TFT M9.

The pull-up driver 1230 may further include a first hold-up capacitor $C_{H1}$ that is connected between the first node A and the second node B to hold the voltage of the first node A not to be decreased even though the leakage current flows on the third TFT M3 and a second hold-up capacitor $C_{H2}$ that is connected between the third node C and the fourth node D to hold the voltage of the third node C not to be decreased even though the leakage current flows on the eighth TFT M8.

Hereinafter, an operational principal of a NOR gate having the above configuration will be described with reference to a timing diagram of FIG. 13.

Figure 13:
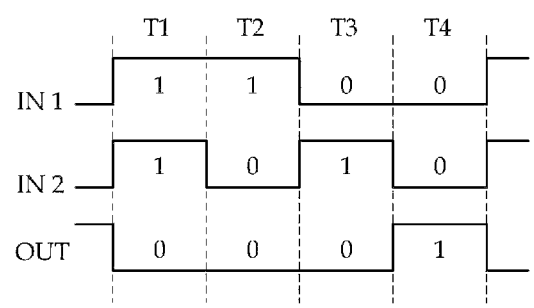
FIG. 13 is a timing diagram of the NOR gate according to the third exemplary embodiment of the present disclosure.
Figure 14:
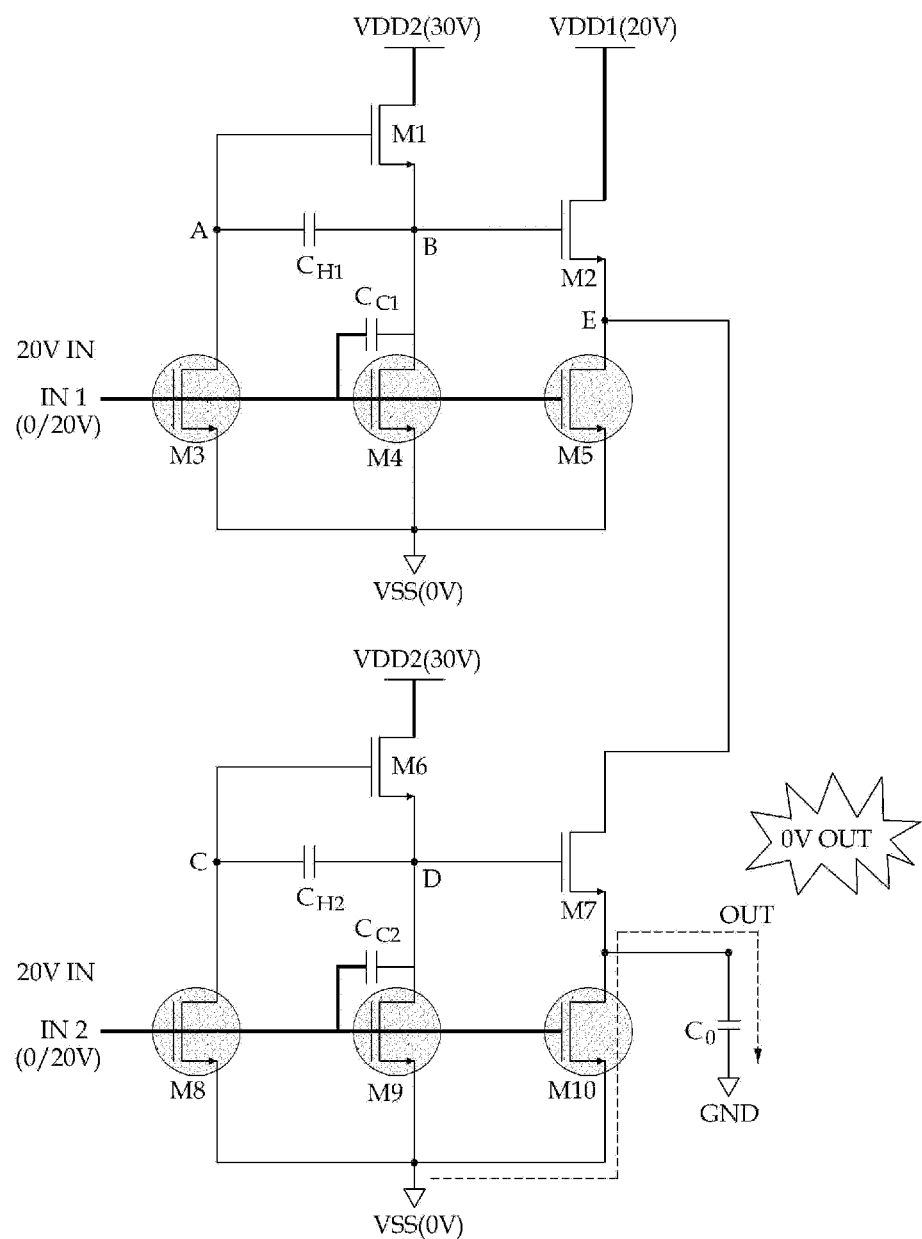
FIG. 14 is a diagram for describing an operational principle of the NOR gate in section T1 of FIG. 13.

FIG. 14 is a diagram for describing an operational principle of the NOR gate in section T1 of FIG. 13.

Referring to FIG. 14, when the first input signal in the high state is inputted into the first input terminal IN1 and the second input signal in the high state is inputted into the second input terminal IN2, the third to fifth TFTs M3 to M5 at the side of the first input terminal IN1 are turned on, and the first TFT M1 and the second TFT M2 are turned off like the inverter. The eighth to tenth TFTs M8 to M10 at the side of the second input terminal IN2 are turned on, and the sixth TFT M6 and the seventh TFT M7 are turned off. In this case, since the tenth TFT M10 is turned on, the output terminal OUT is connected to the ground voltage VSS, such that the output voltage becomes 0 V. In this case, since the first TFT M1, the second TFT M2, and the sixth TFT M6 connected to the first power voltage VDD1 or the second power voltage VDD2 are all turned off, constant current does not flow.

Figure 15:
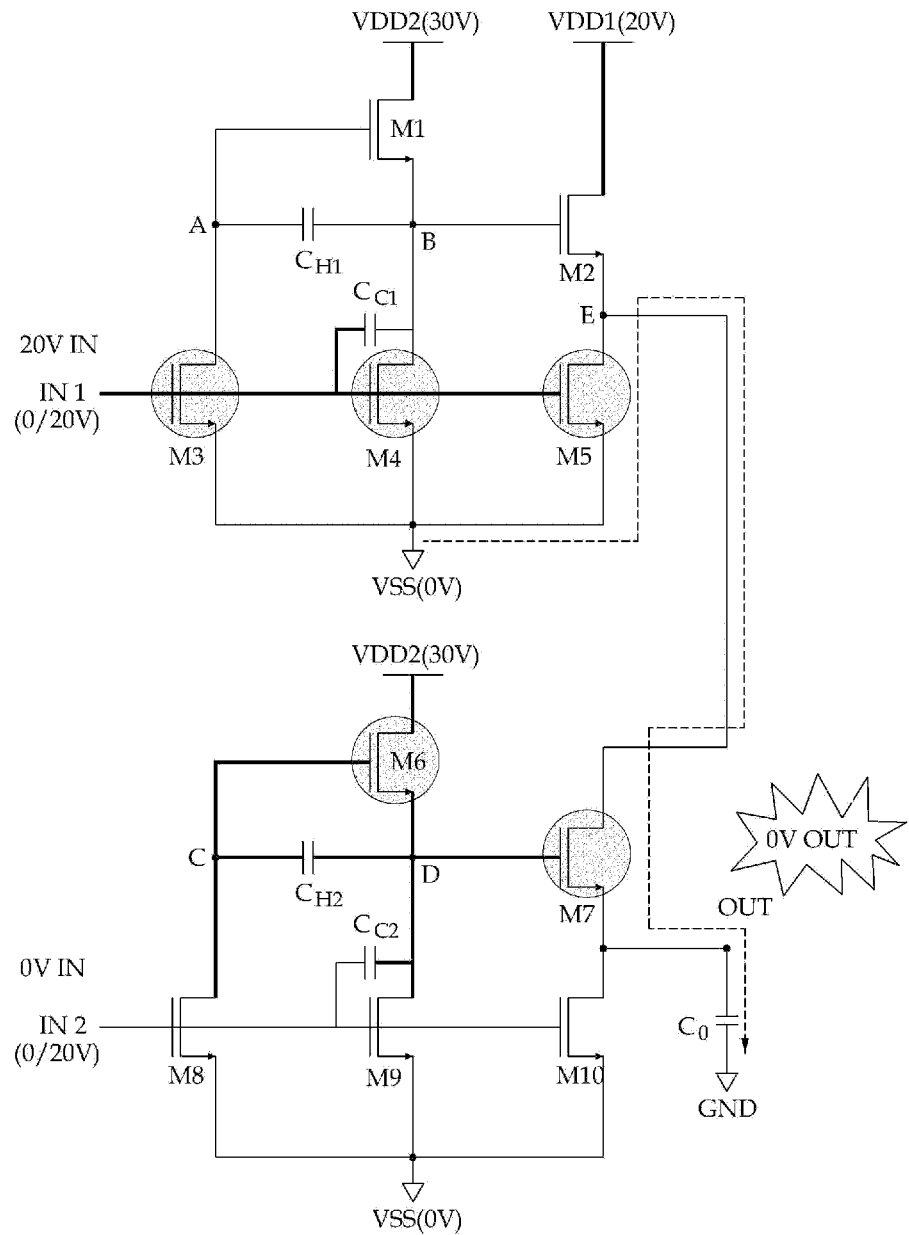
FIG. 15 is a diagram for describing the operational principle of the NOR gate in section T2 of FIG. 13.

FIG. 15 is a diagram for describing the operational principle of the NOR gate in section T2 of FIG. 13.

Referring to FIG. 15, when the first input signal in the high state is inputted into the first input terminal IN1 and the second input signal in the low state is inputted into the second input terminal IN2, the third to fifth TFTs M3 to M5 at the side of the first input terminal IN1 are turned on, and the first TFT M1 and the second TFT M2 are turned off. On the contrary, the eighth to tenth TFTs M8 to M10 at the side of the second input terminal IN2 are turned off, and the sixth TFT M6 and the seventh TFT M7 are turned on. Herein, the sixth TFT M6 is turned on by the asymmetric feed-through effect and the bootstrapping effect like the inverter. In this case, since the tenth TFT M10 is turned off, but the fifth TFT M5 and the seventh TFT M7 are turned on, the output terminal OUT is connected to the ground voltage VSS, such that the output voltage becomes 0 V. In this case, since at least one TFT is turned off between the first power voltage VDD1 and the second power voltage VDD2, and the ground voltage VSS, constant current does not flow.

Figure 16:
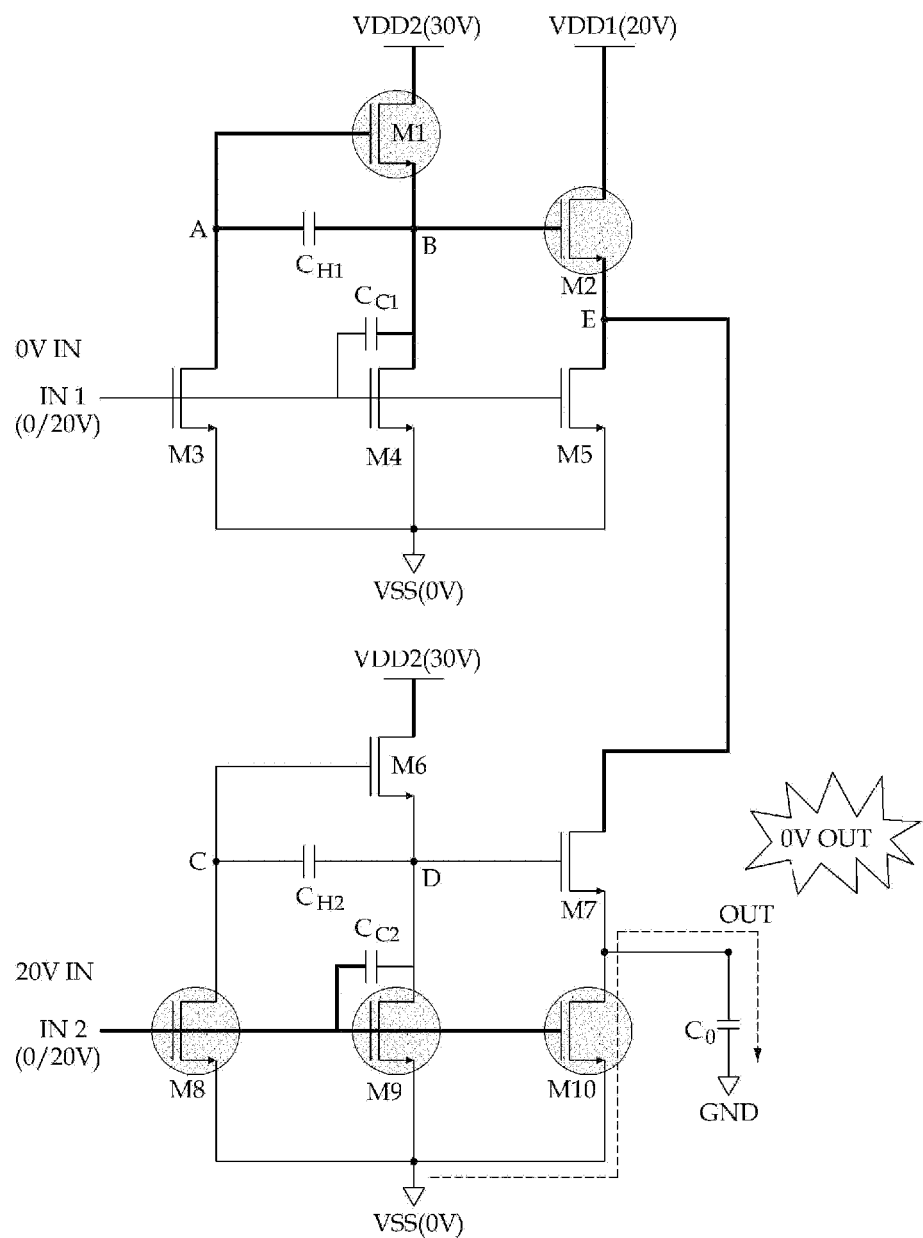
FIG. 16 is a diagram for describing the operational principle of the NOR gate in section T3 of FIG. 13.

FIG. 16 is a diagram for describing the operational principle of the NOR gate in section T3 of FIG. 13.

Referring to FIG. 16, when the first input signal in the low state is inputted into the first input terminal IN1 and the second input signal in the high state is inputted into the second input terminal IN2, the third to fifth TFTs M3 to M5 at the side of the first input terminal IN1 are turned off, and the first TFT M1 and the second TFT M2 are turned on. On the contrary, the eighth to tenth TFTs M8 to M10 at the side of the second input terminal IN2 are turned on, and the sixth TFT M6 and the seventh TFT M7 are turned off. In this case, since the second TFT M2 is turned on, but the seventh TFT M7 is turned off, the output terminal OUT is not connected to the first power voltage VDD1. However, since the tenth TFT M10 is turned on, the ground voltage VSS is connected to the output terminal OUT, such that the output voltage becomes 0 V. In this case, since at least one TFT is turned off between the first power voltage VDD1 and the second power voltage VDD2, and the ground voltage VSS, constant current does not flow.

Figure 17:
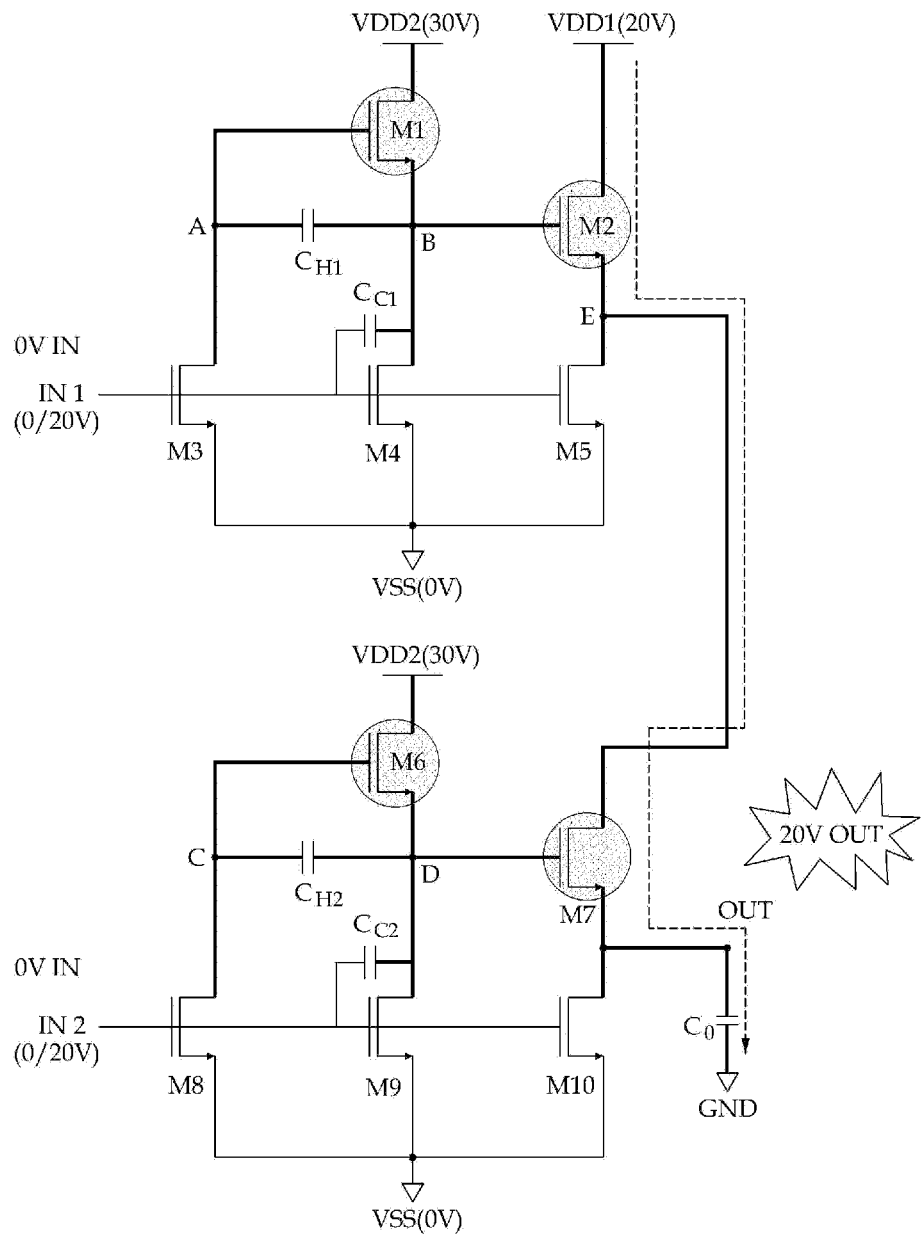
FIG. 17 is a diagram for describing the operational principle of the NOR gate in section T4 of FIG. 13.

FIG. 17 is a diagram for describing the operational principle of the NOR gate in section T4 of FIG. 13.

Referring to FIG. 17, when the first input signal in the low state is inputted into the first input terminal IN1 and the second input signal in the low state is inputted into the second input terminal IN2, the third to fifth TFTs M3 to M5 at the side of the first input terminal IN1 are turned off, and the first TFT M1 and the second TFT M2 are turned on. The eighth to tenth TFTs M8 to M10 at the side of the second input terminal IN2 are turned off, and the sixth TFT M6 and the seventh TFT M7 are turned on. In this case, since the fifth TFT M5 and the tenth TFT M10 are turned off, the output terminal OUT is not connected to the ground voltage VSS. On the contrary, since the second TFT M2 and the seventh TFT M7 are turned on, the first power voltage VDD1 is connected to the output terminal OUT, such that the output voltage becomes 20 V. In this case, since the third to fifth TFTs M3 to M5 and the eighth to tenth TFTs M8 to M10 connected to the ground voltage VSS are all turned off, the constant current does not flow.

Figure 18:
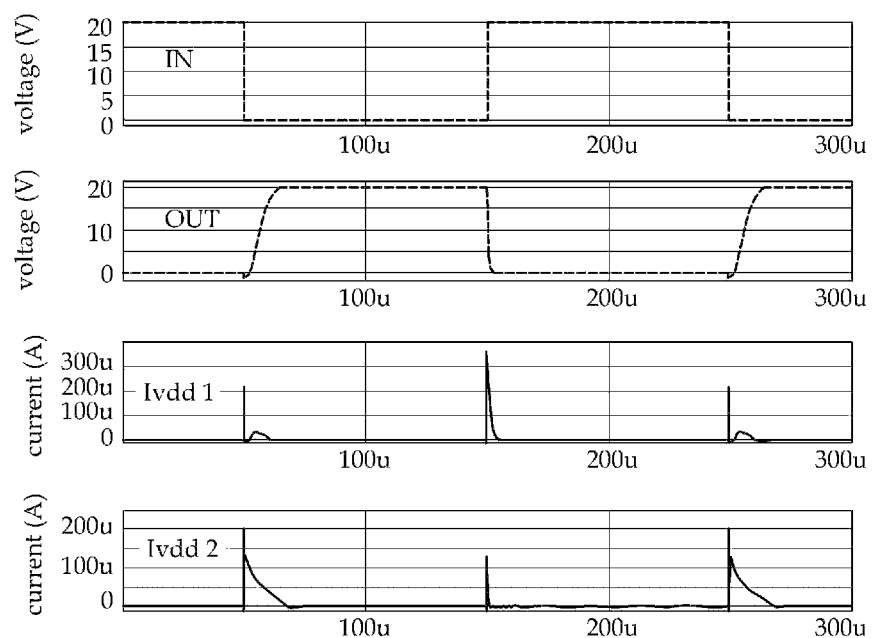
FIG. 18 is a graph showing a SPICE simulation result of the inverter according to the first exemplary embodiment of the present disclosure.

FIG. 18 is a graph showing a SPICE simulation result of the inverter according to the first exemplary embodiment of the present disclosure.

Referring to FIG. 18, in the inverter according to the exemplary embodiment of the present disclosure, an output signal OUT is inverted while maintaining the same voltage width as an input signal IN. In the inverter according to the exemplary embodiment of the present disclosure, only when input and output signals vary, current flows and when the input and output signals are maintained to be high or low, no current flows, such that the inverter is driven at low power consumption equivalent to a CMOS circuit.

Figure 19:
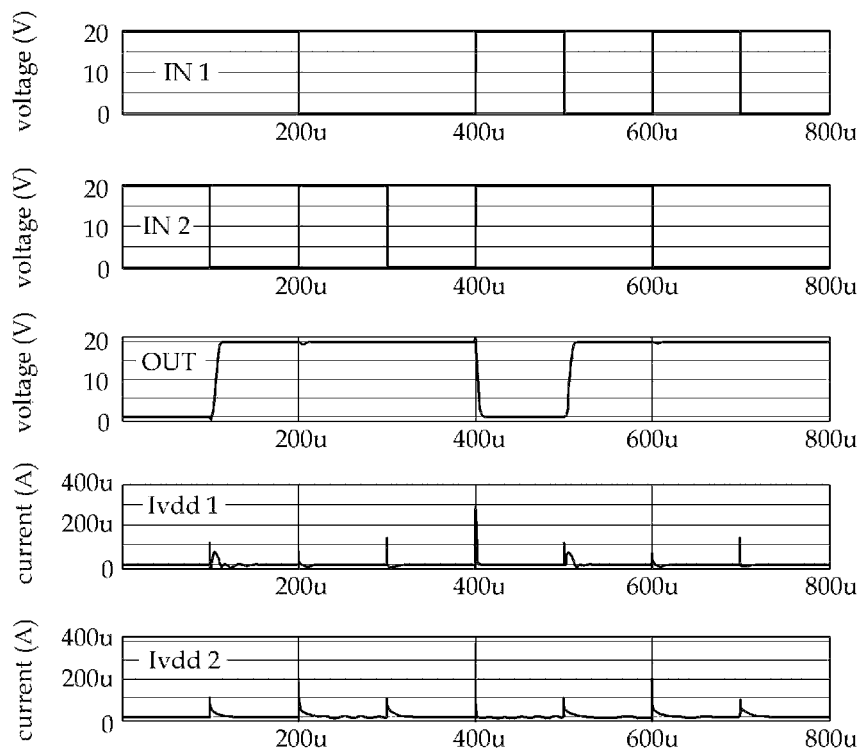
FIG. 19 is a graph showing a SPICE simulation result of the NAND gate according to the second exemplary embodiment of the present disclosure.

FIG. 19 is a graph showing a SPICE simulation result of the NAND gate according to the second exemplary embodiment of the present disclosure.

Referring to FIG. 19, in the NAND gate according to the exemplary embodiment of the present disclosure, only when both input signals IN1 and IN2 are high, the output signal OUT becomes low. In the NAND gate according to the exemplary embodiment of the present disclosure, similarly as in the inverter, only when input and output signals vary, current flows and when the input and output signals are maintained to be high or low, no current flows, such that the NAND gate is driven at low power consumption equivalent to the CMOS circuit.

Figure 20:
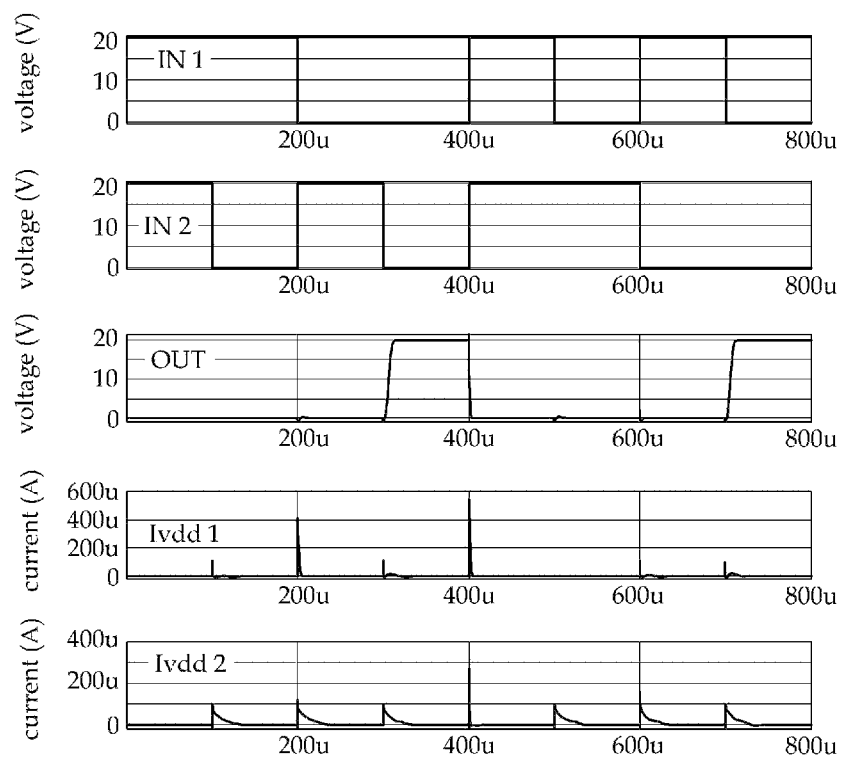
FIG. 20 is a graph showing a SPICE simulation result of the NOR gate according to the third exemplary embodiment of the present disclosure.

FIG. 20 is a graph showing a SPICE simulation result of the NOR gate according to the third exemplary embodiment of the present disclosure.

Referring to FIG. 20, in the NOR gate according to the exemplary embodiment of the present disclosure, only when both input signals IN1 and IN2 are low, the output signal OUT becomes high. In the NOR gate according to the exemplary embodiment of the present disclosure, only when input and output signals vary, current flows and when the input and output signals are maintained to be high or low, no current flows, such that the NOR gate is driven at low power consumption equivalent to the CMOS circuit like the inverter.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A NOR gate, comprising:
   a pull-down unit constituted by a fifth thin film transistor transferring a ground voltage according to a first input signal applied to a gate and a tenth thin film transistor outputting the ground voltage to an output terminal according to a second input signal applied to a gate;
   a pull-up unit constituted by a second thin film transistor transferring a first power voltage according to a voltage applied to a gate and a seventh thin film transistor outputting a ground voltage transferred from the fifth thin film transistor or a first power voltage transferred from the second thin film transistor to the output terminal according to a voltage applied to a gate; and
   a pull-up driver applying a second power voltage or the ground voltage to the gate of the second thin film transistor according to the first input signal and applying the second power voltage or the ground voltage to the gate of the seventh thin film transistor according to the second input signal.

2. The NOR gate of claim 1, wherein the pull-up driver includes:
   a first thin film transistor in which a gate is connected to a first node, a drain is connected to the second power voltage, and a source is connected to a second node;
   a third thin film transistor in which a gate is connected to a first input terminal, a drain is connected to the first node, and a source is connected to the ground voltage;
   a fourth thin film transistor in which a gate is connected to the first input terminal, a drain is connected to the second node, and a source is connected to the ground voltage;
   a first capacitance coupled capacitor connected between the gate and the drain of the fourth thin film transistor;
   a sixth thin film transistor in which a gate is connected to a third node, a drain is connected to the second power voltage and a source is connected to the fourth node;
   an eighth thin film transistor in which a gate is connected to the second input terminal, a drain is connected to the third node, and a source is connected to the ground voltage;
   a ninth thin film transistor in which a gate is connected to the second input terminal, a drain is connected to a fourth node, and a source is connected to the ground voltage; and
   a second capacitance coupled capacitor connected between the gate and the drain of the ninth thin film transistor.

3. The NOR gate of claim 1, wherein the pull-up driver further includes:
   a first hold-up capacitor that is connected between the first node and the second node to hold the voltage of the first node not to be decreased although the leakage current flows on the third thin film transistor; and
   a second hold-up capacitor that is connected between the third node and the fourth node to hold the voltage of the third node not to be decreased although the leakage current flows on the eighth thin film transistor.

4. The NOR gate of claim 1, wherein:
   when a first input signal in a high state is inputted into the first input terminal and a second input signal in the high state is inputted into the second input terminal, the third to fifth thin film transistors are turned on, and the first thin film transistor and the second thin film transistor are turned off, and the eighth to tenth thin film transistors are turned on, and the sixth thin film transistor and the seventh thin film transistor are turned off to output the ground voltage to the output terminal.

5. The NOR gate of claim 1, wherein:

when the first input signal in the high state is inputted into the first input terminal and a second input signal in a low state is inputted into the second input terminal, the third to fifth thin film transistors are turned on, and the first thin film transistor and the second thin film transistor are turned off, and the eighth to tenth thin film transistors are turned off and as the sixth thin film transistor is turned on by asymmetric feed-through and bootstrapping effects, the seventh thin film transistor is turned on to output the ground voltage to the output terminal.

6. The NOR gate of claim 1, wherein:

when the first input signal in the low state is inputted into the first input terminal and a second input signal in the high state is inputted into the second input terminal, the third to fifth thin film transistors are turned off and as the first thin film transistor is turned on by the asymmetric feed-through and bootstrapping effects, the second thin film transistor is turned on, and the eighth to tenth thin film transistors are turned, and the sixth thin film transistor and the seventh thin film transistor are turned off to output the ground voltage to the output terminal.

7. The NOR gate of claim 1, wherein:

when the first input signal in the low state is inputted into the first input terminal and the second input signal in the low state is inputted into the second input terminal, the third to fifth thin film transistors are turned off and as the first thin film transistor is turned on by the asymmetric feed-through and bootstrapping effects, the second thin film transistor is turned on, and the eighth to tenth thin film transistors are turned off, and as the sixth thin film transistor is turned on by the asymmetric feed-through and bootstrapping effects, the seventh thin film transistor is turned on to output the first power voltage to the output terminal.

\* \* \* \* \*